United States Patent
Yu et al.

(10) Patent No.: US 10,126,620 B2
(45) Date of Patent: Nov. 13, 2018

(54) ARRAY SUBSTRATE COMPRISING MULTI-PRIMARY COLOR RESIST SECTIONS DISPOSED IN LIGHT-SHIELDING REGIONS, MANUFACTURING METHOD THEREOF AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Daoping Yu, Beijing (CN); Heecheol Kim, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/508,796

(22) PCT Filed: Aug. 26, 2016

(86) PCT No.: PCT/CN2016/096884
§ 371 (c)(1),
(2) Date: Mar. 3, 2017

(87) PCT Pub. No.: WO2017/118050
PCT Pub. Date: Jul. 13, 2017

(65) Prior Publication Data
US 2018/0143500 A1    May 24, 2018

(30) Foreign Application Priority Data

Jan. 4, 2016 (CN) .......................... 2016 1 0006495

(51) Int. Cl.
*G02F 1/1362* (2006.01)
*G02F 1/1335* (2006.01)
(Continued)

(52) U.S. Cl.
CPC ...... *G02F 1/136286* (2013.01); *G02F 1/1335* (2013.01); *G02F 1/1362* (2013.01);
(Continued)

(58) Field of Classification Search
CPC ..................... H01L 27/1251; H01L 29/66742
See application file for complete search history.

(56) References Cited

U.S. PATENT DOCUMENTS

| 8,933,623 B2 * | 1/2015 | Hanamura ............ H01L 27/322 313/504 |
| 2013/0222747 A1 * | 8/2013 | Hisada .............. G02F 1/134336 349/106 |
| 2015/0309377 A1 | 10/2015 | Choi et al. |

FOREIGN PATENT DOCUMENTS

| CN | 101661204 A | 3/2010 |
| CN | 102628973 A | 8/2012 |

(Continued)

OTHER PUBLICATIONS

International Search Report and Written Opinion dated Nov. 25, 2016; PCT/CN2016/096884.
(Continued)

*Primary Examiner* — Quoc Hoang
(74) *Attorney, Agent, or Firm* — Ladas & Parry LLP

(57) ABSTRACT

An array substrate, a manufacturing method thereof and a display device. The array substrate includes a base substrate; and gate lines and data lines disposed on the base substrate, in which the gate lines and the data lines are intersected to define pixel regions; thin-film transistors (TFTs) are disposed in the pixel regions; a color filter layer is disposed on
(Continued)

the TFTs; the color filter layer includes: single-primary color resist sections disposed in the pixel regions and multi-primary color resist sections disposed in light-shielding regions; the single-primary color resist sections each include a color resist layer of one primary color; and the multi-primary color resist sections each include color resist layers to shield light. Thus, color filters can be formed on the array substrate, the number of patterning processes can be reduced, and the production cost can be lowered.

20 Claims, 5 Drawing Sheets

(51) Int. Cl.
 *G02F 1/1343* (2006.01)
 *G02F 1/1368* (2006.01)
 *H01L 27/12* (2006.01)
 *G02F 1/1339* (2006.01)
(52) U.S. Cl.
 CPC ........ *G02F 1/1368* (2013.01); *G02F 1/13439* (2013.01); *G02F 1/133516* (2013.01); *G02F 1/134309* (2013.01); *G02F 1/136209* (2013.01); *G02F 1/136227* (2013.01); *H01L 27/124* (2013.01); *H01L 27/1248* (2013.01); *H01L 27/1262* (2013.01); *H01L 27/1288* (2013.01); *G02F 1/13394* (2013.01); *G02F 2001/134345* (2013.01); *G02F 2001/136222* (2013.01); *G02F 2201/121* (2013.01); *G02F 2201/124* (2013.01)

(56) References Cited

FOREIGN PATENT DOCUMENTS

| CN | 102681067 A | 9/2012 |
| CN | 102681068 A | 9/2012 |
| CN | 103309081 A | 9/2013 |
| CN | 104932139 A | 9/2015 |
| CN | 105607368 A | 5/2016 |
| JP | 5507738 B2 | 5/2014 |

OTHER PUBLICATIONS

The First Chinese Office Action dated May 23, 2018; Appln. No. 201610006495.8.

* cited by examiner

ARRAY SUBSTRATE COMPRISING MULTI-PRIMARY COLOR RESIST SECTIONS DISPOSED IN LIGHT-SHIELDING REGIONS, MANUFACTURING METHOD THEREOF AND DISPLAY DEVICE

TECHNICAL FIELD

Embodiments of the present invention relate to an array substrate comprising multi-primary color resist sections disposed in light-shielding regions, a manufacturing method thereof and a display device.

BACKGROUND

Liquid crystal displays (LCDs) are widely applied in various display fields, e.g., in electronic products such as computers, mobile phones and TVs, due to the advantages of light weight, low power consumption, low radiation, capability of greatly saving space, etc.

Currently, the manufacturing process of an LCD panel includes independently manufacturing an array substrate and a color filter (CF) substrate and subsequently allowing the array substrate and the color filter substrate to be cell-assembled together. But when the array substrate and the color filter substrate are cell-assembled together, due to the limitation of alignment accuracy, alignment deviation tends to occur and will also result in the defects such as light leakage and reduced transmittance. When black matrixes (BMs) are designed to be wide enough to avoid the problems, the transmittance of the panel will also be reduced and the backlight cost will be increased.

At present, a method to solve the above problems is to form color filters on the array substrate as well. The technology is generally referred to as color filter on array (COA). As illustrated in FIG. 1 which is a schematic structural view of an advanced super dimension switch (ADS) mode array substrate adopting the COA technology, a metal layer 11, a gate insulating layer 12, an active layer 13 (a semiconductor layer) and a source/drain metal layer 14 are sequentially disposed on a base substrate 10 to form thin-film transistors (TFTs) and signal lines. A black matrix 15, a color filter layer 16 and a first transparent electrode 17 are disposed on the TFT, in which the black matrix 15 is disposed on the source/drain metal layer 14 and covers the area corresponding to the TFT. An organic layer 18 and a passivation layer 19 are sequentially disposed on the black matrix 15 and the first transparent electrode 17, and second transparent electrode 20 is disposed on the passivation layer 19. The ADS mode array substrate structure requires more patterning processes in the manufacturing process and hence needs complex processes.

SUMMARY

Embodiments of the present invention provide an array substrate, a manufacturing method thereof and a display device. In the embodiments of the present invention, color filters can be formed on the array substrate, so that the patterning processes can be reduced, and hence the production cost can be lowered.

At least one embodiment of the present disclosure provides an array substrate, comprising: a base substrate; and gate lines and data lines disposed on the base substrate, in which the gate lines and the data lines are intersected to define pixel regions; thin-film transistors (TFTs) are disposed in the pixel regions; a color filter (CF) layer is disposed on the TFTs; the color filter layer includes: single-primary color resist sections disposed in the pixel regions and multi-primary color resist sections disposed in light-shielding regions; the single-primary color resist sections each include a color resist layer of one primary color; and the multi-primary color resist sections each include a plurality of superposed color resist layers to shield light.

For example, in the array substrate according to an embodiment of the present disclosure, the light-shielding regions include areas corresponding to the TFTs, areas corresponding to the gate lines, areas corresponding to the data lines, and a peripheral area of the array substrate required for light shielding.

For example, the array substrate according to an embodiment of the present disclosure further comprises: first transparent electrodes disposed below the color filter layer.

For example, the array substrate according to an embodiment of the present disclosure further comprises: a passivation layer disposed between the first transparent electrodes and the color filter layer.

For example, the array substrate according to an embodiment of the present disclosure further comprises: second transparent electrodes disposed on the color filter layer.

For example, the array substrate according to an embodiment of the present disclosure further comprises: common electrode lines arranged in a same layer as the gate lines, and a metal layer disposed on the second transparent electrodes, wherein the metal layer includes: second common electrode lines disposed at positions over the common electrode lines corresponding to nontransparent areas and connected in parallel with the common electrode lines.

For example, in the array substrate according to an embodiment of the present disclosure, the metal layer further includes: first shielding portions disposed over the data lines.

For example, in the array substrate according to an embodiment of the present disclosure, the metal layer further includes: second shielding portions disposed over the gate lines.

For example, in the array substrate according to an embodiment of the present disclosure, spacers are also disposed on the metal layer; and the metal layer further includes spacer pillows corresponding to the spacers.

For example, the array substrate according to an embodiment of the present disclosure further comprises: pixel electrodes and common electrodes disposed on the color filter layer; both the pixel electrodes and the common electrodes are comb electrodes; comb electrode portions of the pixel electrodes and the common electrodes are intersected and engaged with each other; the pixel electrodes are connected with drain electrodes of the TFTs via third through holes; and the common electrodes are connected with the common electrode lines via fourth through holes.

At least one embodiment of the present disclosure provides a display device, comprising any of the above-described array substrates.

At least one embodiment of the present disclosure provides a method for manufacturing an array substrate, comprising: providing a base substrate; forming gate lines and data lines on the base substrate, in which the gate lines and the data lines are intersected to define pixel regions; forming TFTs in the pixel regions; and forming a color filter layer on the TFTs, in which forming of the color filter layer includes: forming single-primary color resist sections in the pixel regions and forming multi-primary color resist sections in light-shielding regions; the single-primary color resist sections each include a color resist layer of one primary color; and the multi-primary color resist sections each include a plurality of superposed color resist layers to shield light.

For example, in the manufacturing method according to an embodiment of the present disclosure, the pixel regions include first sub-pixel areas, second sub-pixel areas and third sub-pixel areas.

For example, in the manufacturing method according to an embodiment of the present disclosure, forming of the color filter layer further includes: forming a first primary color layer including color resist sections with a first thickness and color resist sections with a second thickness, wherein the color resist sections with the first thickness are formed in the first sub-pixel areas by a patterning process; the color resist sections with the second thickness are formed in light-shielding regions; and the second thickness is less than the first thickness.

For example, in the manufacturing method according to an embodiment of the present disclosure, forming of the color filter layer further includes: forming a second primary color layer including color resist sections with a third thickness and color resist sections with a fourth thickness, in which the color resist sections with the third thickness are formed in the second sub-pixel areas by a patterning process; the color resist sections with the fourth thickness are formed in the light-shielding regions; and the fourth thickness is less than the third thickness.

For example, in the manufacturing method according to an embodiment of the present disclosure, forming of the color filter layer further includes: forming a third primary color layer including color resist sections with a fifth thickness and color resist sections with a sixth thickness, in which the color resist sections with the fifth thickness are formed in the third sub-pixel areas by a patterning process; the color resist sections with the sixth thickness are formed in the light-shielding regions; and the sixth thickness is less than the fifth thickness.

For example, in the manufacturing method according to an embodiment of the present disclosure, before forming the color filter layer, further comprising: forming first transparent electrodes, wherein forming of the first transparent electrodes includes: depositing a transparent conductive layer film, coating photoresist on the transparent conductive layer film, and forming the first transparent electrodes by exposing, developing, etching, and photoresist removing.

For example, in the manufacturing method according to an embodiment of the present disclosure, before forming the first transparent electrodes, the method further comprises: forming a gate insulating layer; and/or after forming the first transparent electrodes and before forming the color filter layer, the method further comprises: forming a passivation layer.

For example, in the manufacturing method according to an embodiment of the present disclosure, after forming the color filter layer, the method further comprises: forming second transparent electrodes and a metal layer; and forming of the second transparent electrodes and the metal layer includes: depositing a transparent conductive layer film and a metal layer film; and forming the second transparent electrodes and the metal layer by patterning the transparent conductive layer film and the metal layer film by half-tone mask process.

For example, the manufacturing method according to an embodiment of the present disclosure further comprises: forming common electrode lines in a same layer as the gate lines, wherein the metal layer includes: second common electrode lines disposed at positions over the common electrode lines corresponding to nontransparent areas and connected in parallel with the common electrode lines.

For example, in the manufacturing method according to an embodiment of the present disclosure, the common electrode lines are connected with common electrodes; and forming of the color filter layer further includes: forming first through holes running through the color filter layer at corresponding connection positions of the common electrode lines and the common electrodes.

For example, the manufacturing method according to an embodiment of the present disclosure, after forming of the color filter layer, further comprises: performing dry etching on the passivation layer and the gate insulating layer by taking the color filter layer as an isolation protective layer, and forming second through holes running through the passivation layer and the gate insulating layer at corresponding connection positions of the common electrode lines and the common electrodes.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

REFERENCE NUMERALS OF THE ACCOMPANYING DRAWINGS

Figure 1:
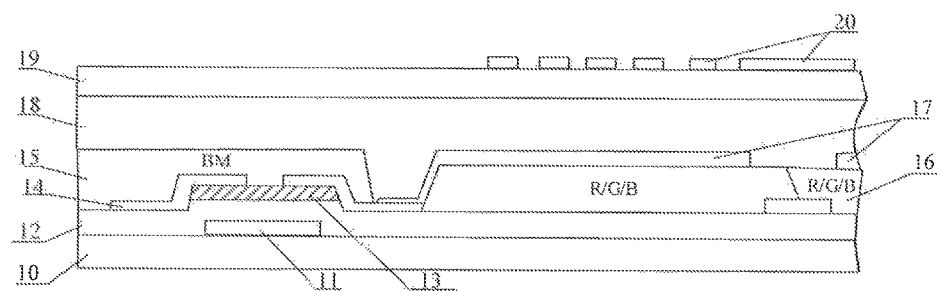
FIG. 1 is a schematic structural view of an ADS array substrate adopting a COA technology.

10—base substrate, 11—gate metal layer, 111—common electrode line, 112—second common electrode line, 12—gate insulating layer, 13—active layer, 14—source/drain metal layer, 141—drain electrode, 15—BM, 16—color filter layer, 17—first transparent electrode, 18—organic layer, 19—passivation layer, 20—second transparent electrode, 30—second substrate, 31—ITO layer, 32—spacer; 41—pixel electrode; 42—common electrode, 43—TFT, 44—gate line, 45—data line, 46—first shielding portion, 47—second shielding portion, 48—light-shielding regions.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiments of the present invention provide an array substrate, a manufacturing method thereof and a display device. In the embodiments of the present invention, color filters (CFs) can be formed on the array substrate, so that the patterning processes can be reduced, and hence the production cost can be lowered.

The array substrate provided by the embodiment of the present invention comprises: a base substrate, and gate lines and data lines disposed on the base substrate, in which the gate lines and the data lines are intersected to define pixel regions; TFTs are disposed in the pixel regions; a color filter layer is disposed on the TFTs and includes: single-primary color resist sections disposed in the pixel regions and multi-primary color resist sections disposed in light-shielding regions; the single-primary color resist section includes a color resist layer of one primary color; and the multi-primary color resist section includes a plurality of superposed color resist layers to shield light.

The color filter layer in the embodiment is also referred to as a color presentation layer (the color filter layer currently formed on an independent substrate can be referred to as a color filter) and is the key for the color display of an LCD. As an LCD is an inactive light emission device, the color display of the LCD requires an internal backlight module to provide a light source; gray-scale display is achieved with the cooperation of driver ICs and liquid crystal orientation control; and subsequently, hue is provided by RGB color layers of the color filter layer, and hence the color display of images can be achieved. The array substrate provided by the embodiment adopts a COA technology. The color filter layer is also formed on the array substrate. After the TFTs are formed on the base substrate, the color filter layer is formed. The positional relationships between the color filter layer and various layers on the array substrate are not limited in the embodiment and may be designed by those skilled in the art according to actual conditions.

For instance, LCD devices mostly adopt the color blending proposal of three primary colors RGB, namely a pixel region includes RGB three sub-pixels. Of course, the proposal is not limited thereto in actual application. The color blending proposals of RGBW, RGBY or the like will also be provided. Description will be given below to the color filter layer in the embodiment by taking the color blending proposal of the three primary colors RGB as an example. The color filter layer includes: single-primary color resist sections disposed in the pixel regions, which are all formed by a color filter layer of a specific kind of primary color, e.g., a R color resist section, a G color filter and a B color filter. In addition, the color filter layer further includes multi-primary color resist sections disposed in the light-shielding regions. The multi-primary color resist section includes an R color resist layer, a G color resist layer and a B color resist layer which are superposed. As the R color resist layer only allows red visible light to run through and blocks visible light of the remaining colors, and similarly, the G color resist layer, and the B color resist layer also only allow visible light of corresponding colors to run through and block visible light of the remaining colors, the RGB three color filter layers can block the visible light of all the colors when superposed together and hence can replace a black matrix to achieve the light-shielding function. As illustrated in FIG. 2a, light-shielding regions 48 generally include areas corresponding to TFTs 43, areas corresponding to data lines 45, areas corresponding to gate lines 44, and a peripheral area of the array substrate required for light shielding.

In the array substrate provided by the embodiment, the color filter layer does not require any special materials, and the COA technology can be achieved by only employing common color filter materials and adopting conventional processes. Moreover, a black matrix layer can be avoided, so that the number of patterning processes can be reduced, and hence the production cost can be lowered. Detailed description will be given below to the technical proposal provided by the present invention for better understanding of the array substrate provided by the embodiment of the present invention.

Figure 2:
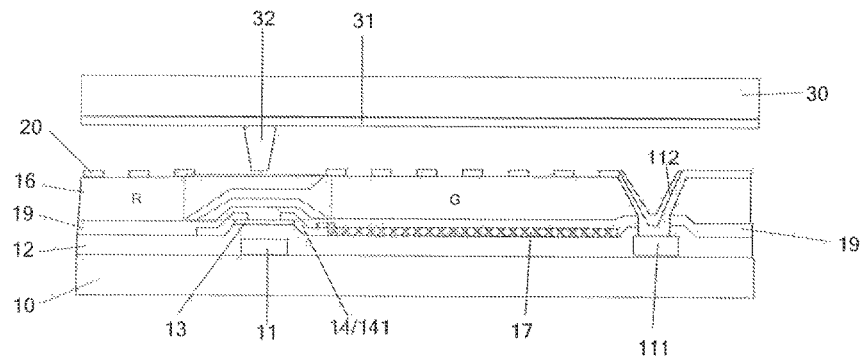
FIG. 2 is a schematic structural view of an ADS array substrate provided by an embodiment of the present invention.
Figure 2A:
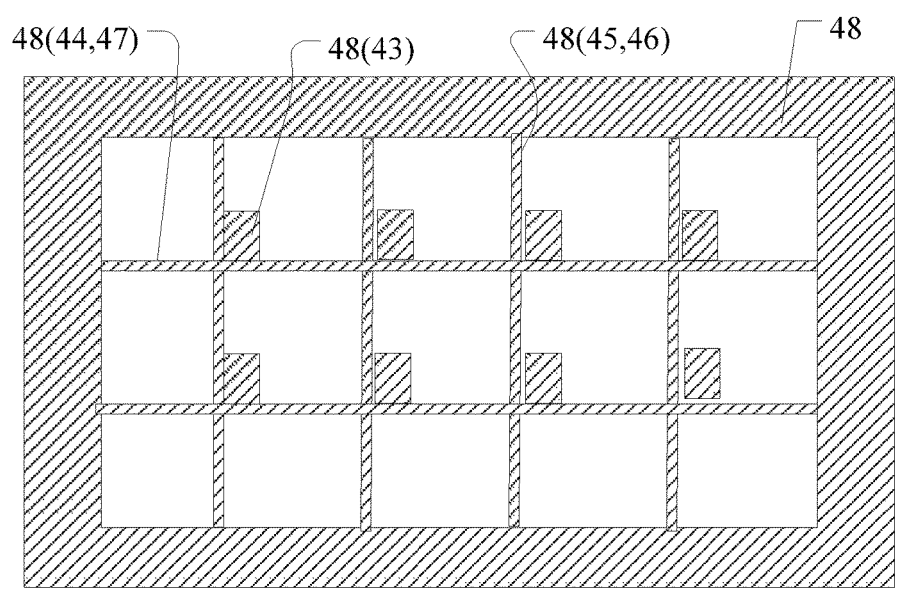
FIG. 2a is a schematic structural plan view of the ADS array substrate provided by an embodiment of the present invention.

For instance, FIG. 2 illustrates an ADS array substrate provided by the embodiment. The array substrate comprises a base substrate 10, and gate lines (disposed in a gate metal layer 11), data lines (not shown) and common electrode lines 111 arranged in the same layer as the gate lines, disposed on the base substrate 10, in which the gate lines and the data lines are intersected to define pixel regions; TFTs are disposed in the pixel regions; a color filter layer 16 is disposed on the TFTs and includes: single-primary color resist sections disposed in the pixel regions and multi-primary color resist sections disposed in light-shielding regions. A single-primary color resist section includes a color resist layer of one primary color; and a multi-primary color resist section includes a plurality of superposed color resist layers to shield light.

The array substrate further comprises: the gate metal layer 11, a gate insulating layer 12, an active layer 13 and a source/drain metal layer 14 sequentially disposed on the base substrate 10. The gate metal layer 11 includes gate electrodes, the gate lines and the common electrode lines 111. Subsequently, first transparent electrodes 17 are formed. The first transparent electrodes 17 are distributed in the pixel regions, are plate electrodes, and are connected to drain electrodes of the TFTs in the form of partially overlap joint. A passivation layer 19, a color filter layer 16 and second transparent electrodes 20 are sequentially formed on the first transparent electrodes 17, namely the passivation layer 19 is disposed between a layer in which the first transparent electrodes 17 are provided and the color filter layer 16, and the second transparent electrodes 20 are disposed on the color filter layer 16. The second transparent electrodes 20 are slit electrodes.

The color filter layer 16 includes single-primary color resist sections disposed in the pixel regions, e.g., R color resist sections, G color resist sections and B color resist sections. In addition, the color filter layer further includes multi-primary color resist sections (as shown by a dotted line area in FIG. 2) disposed in light-shielding regions. A multi-primary color resist section includes an R color resist layer, a G color resist layer and a B color resist layer which are superposed. The light-shielding regions include areas corresponding to the TFTs, areas corresponding to the data lines, areas corresponding to the gate lines, and a peripheral area of the array substrate required for light shielding. The proposal adopts the multi-primary color compensation principle for light shielding and achieves high contrast. In addition, the proposal does not require special materials and can achieve the COA technology by adopting conventional processes and materials. Moreover, a black matrix layer can be saved, so that the patterning processes can be reduced, and hence the cost can be lowered.

In addition, the color filter layer 16 is disposed between the layer provided with the first transparent electrodes 17 and a layer provided with the second transparent electrodes 20. Color filter materials for forming the color filter layer 16 include generally organic insulating materials. The color filter layer 16 can also have the function of an organic layer. Thus, the organic layer can be saved in the embodiment.

Moreover, a metal layer (not shown) is disposed on the second transparent electrode layer 20 in the array substrate. For instance, the metal layer is formed by a half-tone mask process in one patterning process, and the second transparent electrode layer 20 is retained beneath patterns of the metal layer. The patterns of the metal layer can have multiple designs. One optional proposal is that the metal layer includes: second common electrode lines 112 disposed at positions over the common electrode lines corresponding to nontransparent areas and connected in parallel with the common electrode lines, and can reduce the resistance of the common electrode lines and the signal delay caused by the resistance.

Another optional proposal is described below. For instance, as shown in FIG. 2a, the metal layer may further include: first shielding portions 46 disposed over the data lines 45. This part of the metal layer (the first shielding portions 46) is disposed at a border between two pixels and can have the function of light shielding and avoid light leakage. In addition, a transparent conductive layer or a metal layer disposed on the data lines 45 may also shield lateral electric field and avoid light leakage caused by the disorder of liquid crystals at the border, and is particularly important to curved display devices. For instance, the metal layer may further include: second shielding portions 47 disposed over the gate lines 44, the function of which is similar to that of the first shielding portions 46. As the metal layer can increase the capacitive load, the metal layer may be flexibly designed according to the power consumption requirement to form the first shielding portions and the second shielding portions.

Moreover, the metal layer may further include: spacer pillows corresponding to spacers 32. The metal layer may also be retained at positions corresponding to the spacers 32 and taken as the spacer pillows of the spacers 32.

In summary, one metal layer is additionally arranged on the second transparent electrodes 20, may be formed by the half-tone mask process in one patterning process in manufacturing, and hence does not require an additional process; and meanwhile, the added metal layer has many usages, and the positions at which the metal layer is retained may be determined according to actual conditions in specific design. Whether the metal layer is retained for use is mainly comprehensively considered according to the signal delay condition of the common electrode lines and the design of the spacers on an upper substrate. The metal layer can reduce the resistance of the second transparent electrodes and can also shield light leakage and form steps to support post spacers at different heights. Moreover, the number of exposing times can be reduced in the case of the above structure and process.

Figure 3:
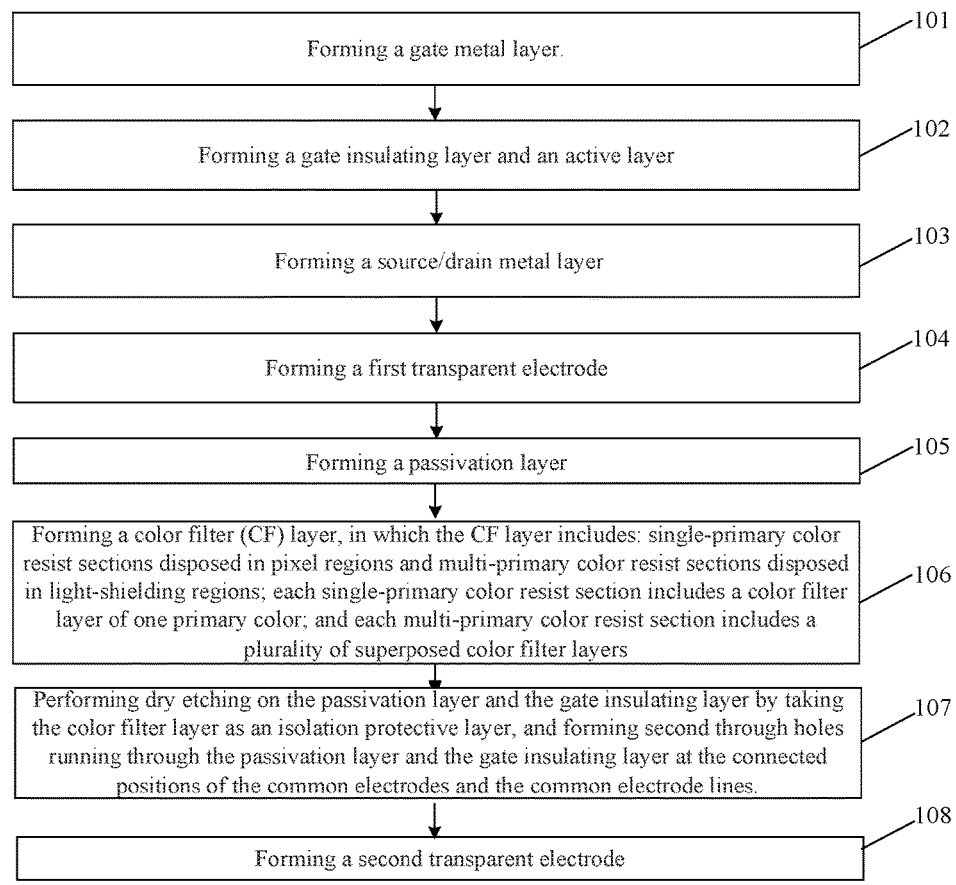
FIG. 3 is a flowchart of a method for manufacturing an ADS array substrate, provided by an embodiment of the present invention.
Figure 4:
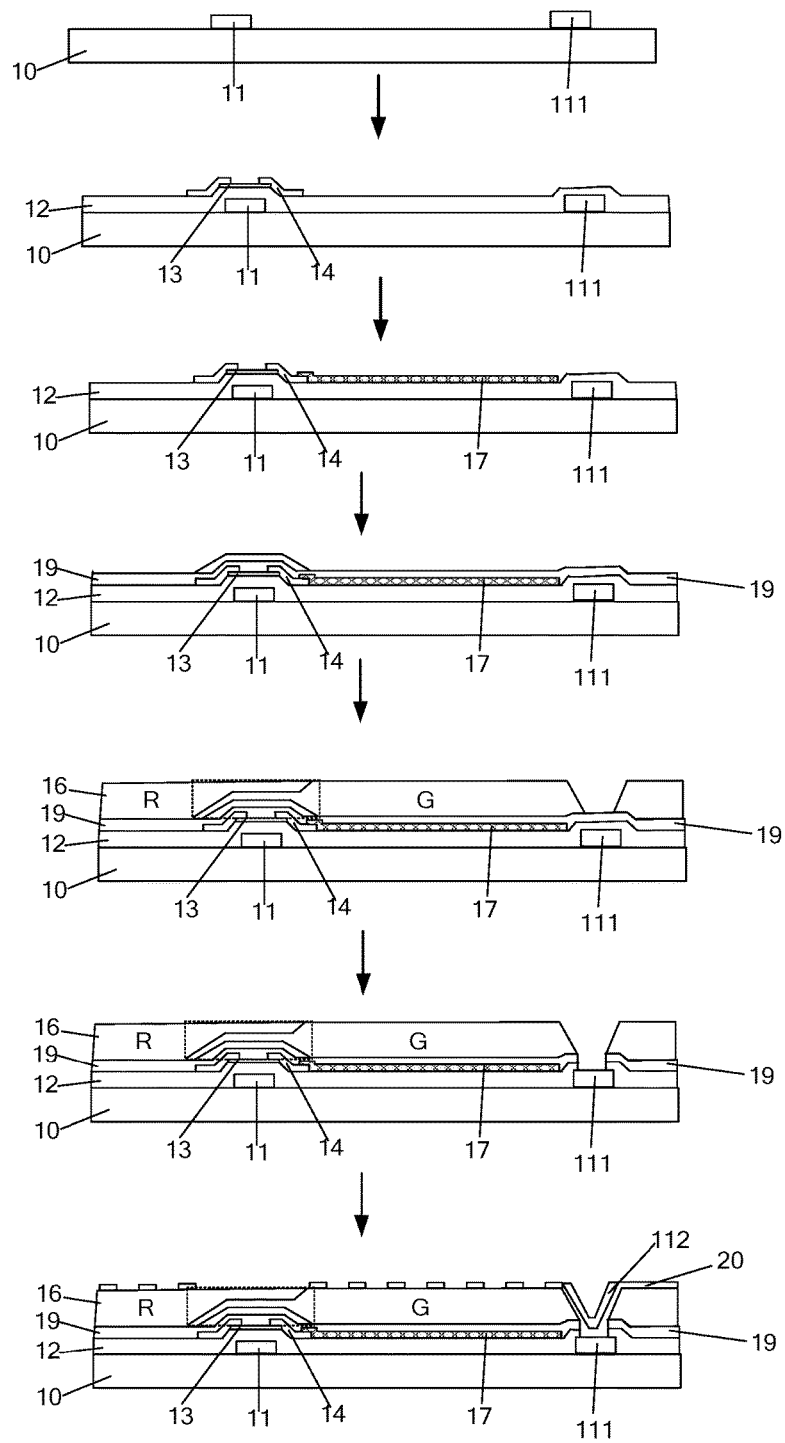
FIG. 4 is a schematic diagram illustrating the manufacturing processes of the ADS array substrate provided by an embodiment of the present invention.

An embodiment of the present invention further provides a method for manufacturing an ADS array substrate. As illustrated in FIGS. 3 and 4, the method comprises the following operations:

S101: forming a gate metal layer 11, in which forming of the gate metal layer includes forming gate lines and common electrode lines 111.

The process is conducted as follows: the gate metal layer including gate electrodes, the gate lines, the common electrode lines and other functional patterns are formed on a base substrate by the steps such as depositing, photoresist coating and exposing, developing, etching and photoresist removing (first mask process).

S102: forming a gate insulating layer 12 and an active layer 13.

In the process, the gate insulating layer 12 and the active layer 13 are sequentially deposited on the substrate. In the step, only the film forming process is performed and the etching process is not performed. In the next process, the active layer 13 and the source/drain metal layer 14 are synchronously formed by the half-tone mask process in one patterning process. Of course, the active layers 13 may also be independently etched in the step.

S103: forming a source/drain metal layer 14.

In the step, patterns of the active layer 13 and the source/drain metal layer 14 are formed by the steps such as depositing, photoresist coating and exposing, developing, etching and photoresist removing (second mask process), and the patterns of the source/drain metal layer 14 include source electrodes, drain electrodes and data lines.

S104: forming first transparent electrodes 17.

In the step, the first transparent electrodes 17 are formed by the steps such as depositing, photoresist coating and exposing, developing, etching and photoresist removing (third mask process).

S105: forming a passivation layer 19. In the step, only the film forming process is performed and the etching process is not performed.

S106: forming a color filter layer 16, in which the color filter layer 16 includes: single-primary color resist sections (RGB color resist sections) disposed in pixel regions and multi-primary color resist sections (as shown by a dotted line area in the figure) disposed in light-shielding regions; the single-primary color resist section includes a color resist layer of one primary color; the multi-primary color resist section includes a plurality of superposed color resist layers; and each color resist layer corresponds to one primary color. As for the general color blending of three primary colors RGB, the step generally requires three mask processes (namely fourth, fifth and sixth mask processes). The pixel region includes a first sub-pixel area, a second sub-pixel area and a third sub-pixel area.

Figure 5:
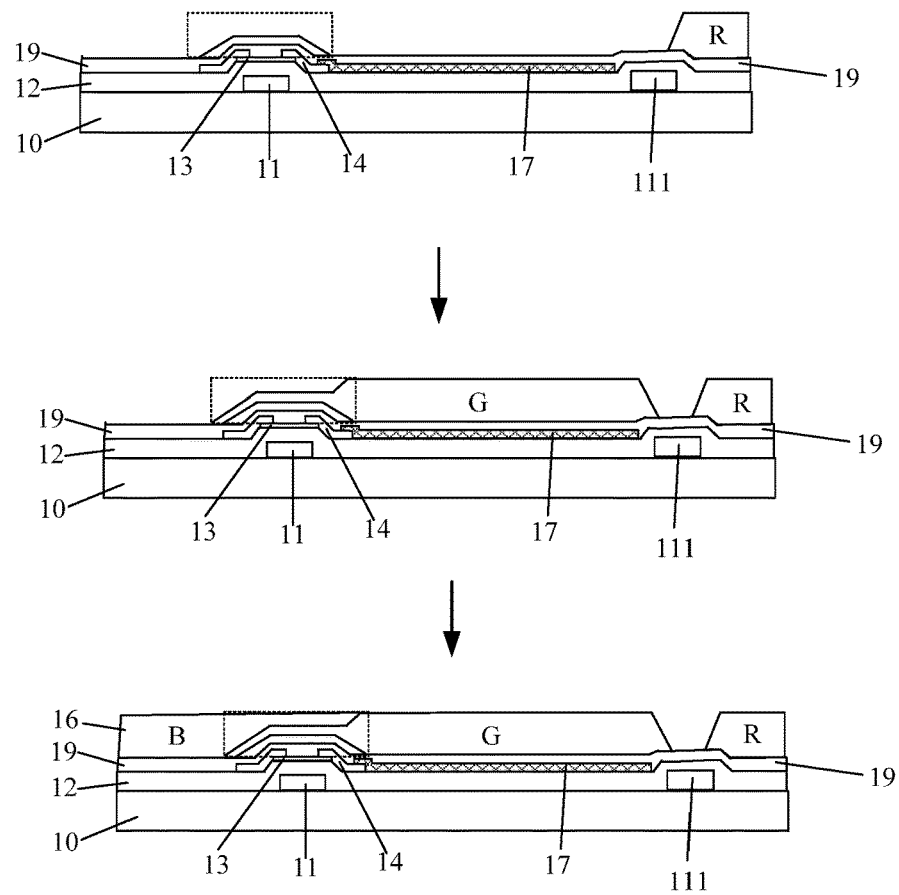
FIG. 5 is a schematic diagram illustrating the processes of forming a color filter layer in the ADS array substrate provided by an embodiment of the present invention.

For instance, as illustrated in FIG. 5, the step of forming the color filter layer includes: forming a first primary color layer (e.g., R color resist sections), and forming color resist sections with a first thickness in the first sub-pixel areas and forming color resist sections with a second thickness in the light-shielding regions by a patterning process, in which the second thickness is less than the first thickness; forming a second primary color layer (e.g., G color resist sections), and forming color resist sections with a third thickness in the second sub-pixel areas and forming color resist sections with a fourth thickness in the light-shielding regions by a patterning process, in which the fourth thickness is less than the third thickness; and forming a third primary color layer (e.g., B color resist sections), and forming color resist sections with a fifth thickness in the third sub-pixel areas and forming color resist sections with a sixth thickness in the light-shielding regions by a patterning process, in which the sixth thickness is less than the fifth thickness. In the light-shielding regions, the color resist sections with the second thickness, the fourth thickness and the sixth thickness are combined to achieve the light-shielding effect, in which the first thickness, the third thickness and the fifth thickness are equal, and the second thickness, the fourth thickness and the sixth thickness are equal. The patterning process is a half-tone mask process.

It should be noted that in the above step of forming the color filter layer, the color resist is not retained at connection positions of common electrodes and the common electrode lines (namely positions at which first through holes are formed).

S107: performing a dry etching process on the passivation layer 19 and the gate insulating layer 12 by taking the color filter layer 16 as an isolation protective layer, and forming second through holes running through the passivation layer 19 and the gate insulating layer 12 at the connection positions of the common electrodes and the common electrode lines.

In the step, the passivation layer 19 and the gate insulating layer 12 are dry-etched by directly taking color presentation resist (the color filter layer 16) as spacers, and the passivation layer 19 and the gate insulating layer 12 on the common electrode lines formed in the first patterning process are etched to form the second through holes which are used in the step S108 to lead out the common electrode lines via transparent conductive materials (a second transparent electrode layer).

S108: forming second transparent electrodes 20.

In the step, the second transparent electrodes 20 are formed by the steps such as depositing, photoresist coating and exposing, developing, etching and photoresist removing (seventh mask process).

For instance, in the step, a metal layer may further be formed on the layer provided with the second transparent electrodes 20. The metal layer includes second common electrode lines 112 disposed at positions over the common electrode lines corresponding to nontransparent areas and connected in parallel with the common electrode lines; and/or first shielding portions disposed over the data lines; and/or second shielding portions disposed over the gate lines; and/or spacer pillows (generally disposed at areas corresponding to the gate lines) corresponding to the spacers.

For instance, the step of forming the second transparent electrodes includes: depositing a transparent conductive layer and a metal layer; and forming the second electrodes and a patterned metal layer by a half-tone mask process. The patterned metal layer may include: the second common electrode lines 112 disposed at the positions over the common electrode lines corresponding to the nontransparent areas and connected in parallel with the common electrode lines. The patterned metal layer may also include the first shielding portions disposed over the data lines; and/or the second shielding portions disposed over the gate lines; and/or the spacer pillows (generally disposed at areas corresponding to the gate lines) corresponding to the spacers.

The foregoing describes the manufacturing process of the ADS array substrate provided by the embodiment of the present invention; no special materials are required; and the array substrate capable of achieving the COA technology may be manufactured by only 7 mask processes by using conventional color filter materials. The steps of forming a black matrix and the organic layer can be saved, so that the number of the mask processes can be reduced, and hence the production cost can be lowered. Meanwhile, the metal layer is disposed on the second transparent electrode layer to form the second common electrode lines and the shielding portions, so that the resistance of the common electrodes can be reduced. In addition, the shielding portions are formed on the data lines to have the function of shielding lateral electric field, so that the problem of light leakage can be solved. Moreover, the metal layer may be taken as the spacer pillows of the spacers and corresponds to post spacers at different heights.

As illustrated in FIG. 2, an indium tin oxide (ITO) layer 31 is formed on a second substrate 30 at first, can shield stable external electric field of the ADS structure, and can also ensure the adhesion property of the spacers; and subsequently, spacers 32 made from a conventional material can be formed on the ITO layer 31. In addition, as for the second substrate 30, a transparent conductive shielding layer may further be formed on the back side of the second substrate 30, and post spacers of different heights are formed on the front side (one side facing the array substrate) of the second substrate 30.

After the second substrate and the array substrate are cell-assembled together, a complete set of COA processes are finished, and the entire liquid crystal cell process stage only requires 8 to 9 mask processes. Conventionally, a black matrix is formed on an opposing substrate, and black post spacers (BPSs) are formed by a special material (the material requirements of both the black matrix and the spacers are satisfied), so that the functions of the black matrix and the spacers can be simultaneously achieved. However, as the materials which satisfy both the light-shielding requirement and the elasticity requirement of the spacers are difficult to find, the cost is increased. As the embodiment only needs color filter materials, the production cost can be lowered.

Figure 6:
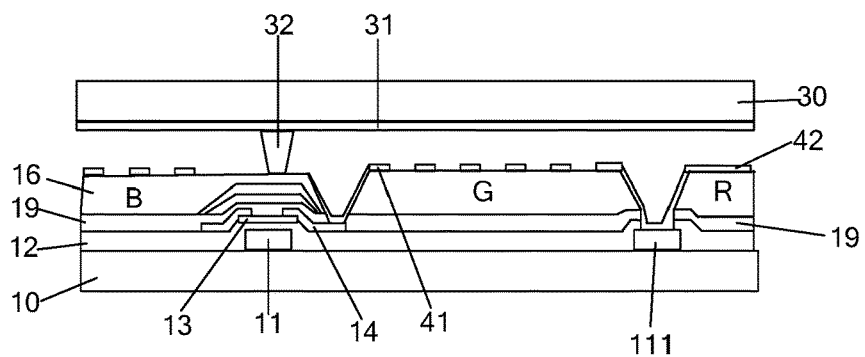
FIG. 6 is a schematic structural view of an in-plane switching (IPS) array substrate provided by an embodiment of the present invention.

As illustrated in FIG. 6, an embodiment of the present invention further provides a structure and a manufacturing method of an in-plane switch (IPS) array substrate, which are similar to the structure and the manufacturing method of the ADS array substrate. For instance, as illustrated in FIG. 6, the difference lies in that the processes in the steps S101 to S108 are modified. In the process of forming the IPS array substrate, the step of forming the first transparent electrodes (S104) is not performed. In the step of forming the second transparent electrodes 20 (S108), pixel electrodes 41 and common electrodes 42 are synchronously formed; both the pixel electrodes 41 and the common electrodes 42 are comb electrodes; the comb electrode portions of the pixel electrodes and the comb electrode portions of the common electrodes are intersected and engaged with each other (the electrode portions are spaced from each other for a certain distance to form space and plane electric fields); the pixel electrodes 41 are connected with drain electrodes 141 of TFTs via third through holes; and the common electrodes 42 are connected with common electrode lines via fourth through holes. Therefore, one mask process can be saved, so the IPS COA structure can be achieved by 6 mask processes.

In the manufacturing process of the IPS array substrate, no special materials are required, and the array substrate capable of achieving the COA technology can be formed by only 6 mask processes by using conventional color filter materials, so that the steps of forming a black matrix and an organic layer can be saved. Thus, the mask processes can be reduced, and hence the production cost can be lowered. Meanwhile, a metal layer is disposed on the pixel electrodes to form second common electrode lines and shielding portions, so that the resistance of the common electrode lines can be reduced. In addition, shielding portions are formed on data lines to have the function of shielding lateral electric field, so that the problem of light leakage can be solved. Moreover, the metal layer may be taken as spacer pillows of spacers and corresponds to post spacers at different heights.

As illustrated in FIG. 6, an ITO layer 31 is formed on a second substrate 30 at first, can shield stable external electric field of the IPS structure, and can also ensure the adhesivity of the spacers; and subsequently, spacers 32 made from a conventional material are formed on the ITO layer 31. In addition, as for the second substrate 30, a transparent conductive shielding layer may also be formed on the back side of the second substrate 30, and post spacers at different heights are formed on the front side (one side facing the array substrate) of the second substrate 30.

After the second substrate and the array substrate are cell-assembled together, a complete set of COA processes is finished, and the entire liquid crystal cell stage only requires 7 to 8 mask processes. Conventionally, a black matrix is formed on an opposing substrate, and black post spacers are formed by a special material (the material requirements of both the black matrix and the spacers are satisfied), so that the functions of the black matrix and the spacers can be simultaneously achieved. However, as the materials which satisfy both the light-shielding requirement and the elasticity requirement of the spacers are difficult to find, the cost is increased. As the embodiment only requires color filter materials, the production cost can be lowered.

The embodiment of the present invention further provides a display device, which comprises any foregoing array substrate. The display device has low cost and high resolution and solves the problem of light leakage of ADS/IPS. The display device may be: any product or component with display function such as an LCD panel, e-paper, a mobile phone, a tablet PC, a TV, a display, a notebook computer, a digital picture frame and a navigator.

It should be noted that although the present invention takes the array substrate of the ADS/IPS mode as an example, the examples are only given for convenient description and the present invention is not limited to these examples. The present invention may also be applied in array substrates and displays with other structures.

The embodiments of the present invention provide the array substrate, the manufacturing method thereof and the display device. The color filter layer is disposed on the array substrate, and not only includes the single-primary color resist layers disposed in the pixel regions but also includes the superposed color resist layers formed in the light-shielding regions such as the gate lines, the data lines and the peripheral area. The proposal adopts the multi-primary color compensation principle for light shielding and achieves high contrast. In addition, the proposal does not require special materials and can achieve the COA technology by adopting conventional processes and materials. Moreover, a black matrix layer can be saved, so that the patterning processes can be reduced, and hence the cost can be lowered.

All the embodiments in the description are described in a progressive manner, and identical and similar parts of the embodiments can refer to each other. Each embodiment will focus on the differences from other embodiments. In particular, as for a device embodiment, because it is substantially similar to a method embodiment, the description is relatively simple, and the relevant parts can be seen in parts of the description of the method embodiment.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The application claims priority to the Chinese patent application No. 201610006495.8, filed Jan. 4, 2016, the entire disclosure of which is incorporated herein by reference as part of the present application.

What is claimed is:

1. An array substrate, comprising:
   a base substrate; and
   gate lines and data lines disposed on the base substrate, in which the gate lines and the data lines are intersected to define pixel regions; thin-film transistors (TFTs) are disposed in the pixel regions; a color filter (CF) layer is disposed on the TFTs;
   the color filter layer includes: single-primary color resist sections disposed in the pixel regions and multi-primary color resist sections disposed in light-shielding regions; the single-primary color resist sections each include a color resist layer of one primary color; and the multi-primary color resist sections each include a plurality of superposed color resist layers to shield light; and
   the pixel regions include a red pixel region, a green pixel region and a blue pixel region, and the multi-primary color resist sections are disposed in the light shielding regions surrounding the red pixel region, the green pixel region and the blue pixel region.

2. The array substrate according to claim 1, wherein the light-shielding regions include areas corresponding to the TFTs, areas corresponding to the gate lines, areas corresponding to the data lines, and a peripheral area of the array substrate required for light shielding.

3. The array substrate according to claim 1, further comprising: first transparent electrodes disposed below the color filter layer.

4. The array substrate according to claim 3, further comprising: a passivation layer disposed between the first transparent electrodes and the color filter layer.

5. The array substrate according to claim 1, further comprising: pixel electrodes and common electrodes disposed on the color filter layer,
   wherein both the pixel electrodes and the common electrodes are comb electrodes; comb electrode portions of the pixel electrodes and the common electrodes are intersected and engaged with each other;
   the pixel electrodes are connected with drain electrodes of the TFTs via third through holes; and
   the common electrodes are connected with the common electrode lines via fourth through holes.

6. A display device, comprising the array substrate according to claim 1.

7. An array substrate, comprising:
   a base substrate;
   gate lines and data lines disposed on the base substrate, in which the gate lines and the data lines are intersected to define pixel regions; thin-film transistors (TFTs) are disposed in the pixel regions; a color filter (CF) layer is disposed on the TFTs; and
   second transparent electrodes disposed on the color filter layer;
   the color filter layer includes: single-primary color resist sections disposed in the pixel regions and multi-primary color resist sections disposed in light-shielding regions; the single-primary color resist sections each include a color resist layer of one primary color; and the multi-primary color resist sections each include a plurality of superposed color resist layers to shield light.

8. The array substrate according to claim 7, further comprising: common electrode lines arranged in a same layer as the gate lines, and a metal layer disposed on the second transparent electrodes, wherein the metal layer includes: second common electrode lines disposed at positions over the common electrode lines corresponding to nontransparent areas and connected in parallel with the common electrode lines.

9. The array substrate according to claim 8, wherein the metal layer further includes: first shielding portions disposed over the data lines.

10. The array substrate according to claim 8, wherein the metal layer further includes: second shielding portions disposed over the gate lines.

11. The array substrate according to claim 8, wherein spacers are also disposed on the metal layer; and the metal layer further includes spacer pillows corresponding to the spacers.

12. A method for manufacturing an array substrate, comprising:
providing a base substrate;
forming gate lines and data lines on the base substrate, in which the gate lines and the data lines are intersected to define pixel regions;
forming TFTs in the pixel regions; and
forming a color filter layer on the TFTs, in which forming of the color filter layer includes: forming single-primary color resist sections in the pixel regions and forming multi-primary color resist sections in light-shielding regions; the single-primary color resist sections each include a color resist layer of one primary color; and the multi-primary color resist sections each include a plurality of superposed color resist layers to shield light;
wherein the pixel regions include a red pixel region, a green pixel region and a blue pixel region, and the multi-primary color resist sections are formed in the light shielding regions surrounding the red pixel region, the green pixel region and the blue pixel region.

13. The manufacturing method according to claim 12, wherein the pixel regions include first sub-pixel areas, second sub-pixel areas and third sub-pixel areas.

14. The manufacturing method according to claim 13, wherein forming of the color filter layer further includes:
forming a first primary color layer including color resist sections with a first thickness and color resist sections with a second thickness, wherein the color resist sections with the first thickness are formed in the first sub-pixel areas by a patterning process; the color resist sections with the second thickness are formed in light-shielding regions; and the second thickness is less than the first thickness.

15. The manufacturing method according to claim 14, wherein forming of the color filter layer further includes:
forming a second primary color layer including color resist sections with a third thickness and color resist sections with a fourth thickness, in which the color resist sections with the third thickness are formed in the second sub-pixel areas by a patterning process; the color resist sections with the fourth thickness are formed in the light-shielding regions; and the fourth thickness is less than the third thickness.

16. The manufacturing method according to claim 15, wherein forming of the color filter layer further includes:
forming a third primary color layer including color resist sections with a fifth thickness and color resist sections with a sixth thickness, in which the color resist sections with the fifth thickness are formed in the third sub-pixel areas by a patterning process; the color resist sections with the sixth thickness are formed in the light-shielding regions; and the sixth thickness is less than the fifth thickness.

17. The manufacturing method according to claim 12, before forming the color filter layer, further comprising: forming first transparent electrodes,
wherein forming of the first transparent electrodes includes: depositing a transparent conductive layer film, coating photoresist on the transparent conductive layer film, and forming the first transparent electrodes by exposing, developing, etching, and photoresist removing.

18. The manufacturing method according to claim 17, wherein
before forming the first transparent electrodes, the method further comprises: forming a gate insulating layer; and/or
after forming the first transparent electrodes and before forming the color filter layer, the method further comprises: forming a passivation layer.

19. The manufacturing method according to claim 18, wherein
after forming the color filter layer, the method further comprises: forming second transparent electrodes and a metal layer; and
forming of the second transparent electrodes and the metal layer includes:
depositing a transparent conductive layer film and a metal layer film; and
forming the second transparent electrodes and the metal layer by patterning the transparent conductive layer film and the metal layer film by half-tone mask process.

20. The manufacturing method according to claim 19, further comprising: forming common electrode lines in a same layer as the gate lines, wherein the metal layer includes: second common electrode lines disposed at positions over the common electrode lines corresponding to nontransparent areas and connected in parallel with the common electrode lines.

* * * * *